(12) United States Patent
Mizutani et al.

(10) Patent No.: US 9,113,562 B2
(45) Date of Patent: Aug. 18, 2015

(54) MANUFACTURING METHOD FOR PRINTED WIRING BOARD

(75) Inventors: Hideo Mizutani, Ogaki (JP); Toshiyuki Matsui, Ogaki (JP); Atsushi Deguchi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 527 days.

(21) Appl. No.: 13/427,330

(22) Filed: Mar. 22, 2012

(65) Prior Publication Data

US 2012/0180313 A1 Jul. 19, 2012

Related U.S. Application Data

(63) Continuation of application No. 12/771,602, filed on Apr. 30, 2010, now Pat. No. 8,161,637.

(60) Provisional application No. 61/228,280, filed on Jul. 24, 2009.

(51) Int. Cl.
*H05K 3/02* (2006.01)
*H05K 3/10* (2006.01)
*H05K 3/06* (2006.01)
*H05K 3/46* (2006.01)

(52) U.S. Cl.
CPC .............. *H05K 3/108* (2013.01); *H05K 3/067* (2013.01); *H05K 3/4661* (2013.01); *H05K 2203/0369* (2013.01); *H05K 2203/0597* (2013.01); *H05K 2203/122* (2013.01); *H05K 2203/124* (2013.01); *H05K 2203/1476* (2013.01); *Y10T 29/49126* (2015.01); *Y10T 29/49144* (2015.01); *Y10T 29/49156* (2015.01); *Y10T 29/49165* (2015.01)

(58) Field of Classification Search
CPC ...... H05K 3/108; H05K 3/067; H05K 3/4561; H05K 2203/0369; H05K 2203/0597; H05K 2203/122; H05K 2203/124; H05K 2203/1476
USPC ............ 29/830, 840; 427/96.1, 97.1; 438/638
See application file for complete search history.

(56) References Cited

U.S. PATENT DOCUMENTS 5,939,789 A 8/1999 Kawai et al.
6,565,731 B1 5/2003 Couble et al.
7,188,412 B2 3/2007 Yazaki et al.
7,278,205 B2 10/2007 Miyazaki et al.

(Continued)

FOREIGN PATENT DOCUMENTS

JP 2001135916 A * 5/2001
JP 2003-140364 5/2003

(Continued)

*Primary Examiner* — Carl Arbes
(74) *Attorney, Agent, or Firm* — Oblon, McClelland, Maier & Neustadt, L.L.P.

(57) ABSTRACT

A manufacturing method for a printed wiring board includes forming an electroless plated film on an interlayer resin insulation layer, forming on the electroless plated film a plating resist with an opening to expose a portion of the electroless plated film, forming an electrolytic plated film on the portion of the electroless plated film exposed through the opening, removing the plating resist using a resist-removing solution containing an amine, reducing a thickness of a portion of the electroless plated film existing between adjacent portions of the electrolytic plated film by using the resist-removing solution, and forming a conductive pattern by removing the portion of the electroless plated film existing between the adjacent portions of the electrolytic plated film by using an etchant.

20 Claims, 11 Drawing Sheets

(56) References Cited

U.S. PATENT DOCUMENTS

| | | |
|---|---|---|
| 7,585,541 B2 | 9/2009 | Wakihara et al. |
| 7,614,145 B2 | 11/2009 | Wakizaka et al. |
| 7,687,381 B2 | 3/2010 | Kim et al. |
| 7,707,715 B2 | 5/2010 | Okabe et al. |
| 2009/0056119 A1 | 3/2009 | Okabe et al. |

FOREIGN PATENT DOCUMENTS

| | | |
|---|---|---|
| JP | 3711565 B2 | 8/2005 |
| TW | 200300523 A | 6/2003 |
| TW | 200515851 A | 5/2005 |
| TW | 200814878 A | 3/2008 |
| WO | 01/13686 A1 | 2/2001 |

* cited by examiner

MANUFACTURING METHOD FOR PRINTED WIRING BOARD

CROSS-REFERENCE TO RELATED APPLICATIONS

The present application is a continuation of and claims the benefit of priority to U.S. application Ser. No. 12/771,602, filed Apr. 30, 2010, which is based upon and claims the benefit of priority to U.S. Application No. 61/228,280, filed Jul. 24, 2009. The entire contents of these applications are incorporated herein by reference.

BACKGROUND OF THE INVENTION

1. Field of the Invention

The present invention relates to a manufacturing method for forming an electrolytic plated film on an electroless plated film.

2. Discussion of the Background

In International Publication No. WO 01/13686, a method for forming wiring by a semi-additive method (SAP) is described. In such a method, an electroless copper-plated film is formed on an insulation layer. Then, on the electroless copper-plated film, a plating resist with an opening that exposes part of the film is formed. Next, an electrolytic copper-plated film is formed on the electroless copper-plated film exposed through the opening. Then, after the plating resist is removed using a resist-removing solution, the electroless copper-plated film is removed by an etchant. In doing so, a conductive pattern (wiring) is formed, made of an electroless copper-plated film and an electrolytic copper-plated film. Recently, wiring pitch has become finer, and trends require an even smaller L (wiring width)/S (wiring space). However, using a manufacturing method described in the above International Publication No. WO 01/13686, when etching an electroless copper-plated film, it is thought that an electrolytic copper-plated film made of the same material may also be etched. There is a concern that as a result, wiring may become narrower. Thus, it may be an option to form thicker electrolytic copper-plated film in an opening of a plating resist, while taking into consideration the etching amount in advance. However, in such a case, it is thought that the adhesiveness of the resist will be reduced because the width of the plating resist decreases (conversely, the aspect ratio increases). Accordingly, there is a concern that the plating resist may peel off, for example, while the substrate is being washed with water after development or being handled.

The contents of International Publication No. WO 01/13686 are incorporated herein by reference in their entirety in the present application.

SUMMARY OF THE INVENTION

According to one aspect of the present invention, a manufacturing method for a printed wiring board includes forming an electroless plated film on an interlayer resin insulation layer, forming on the electroless plated film a plating resist with an opening to expose a portion of the electroless plated film, forming an electrolytic plated film on the portion of the electroless plated film exposed through the opening, removing the plating resist using a resist-removing solution containing an amine, reducing a thickness of a portion of the electroless plated film existing between adjacent portions of the electrolytic plated film by using the resist-removing solution, and forming a conductive pattern by removing the portion of the electroless plated film existing between the adjacent portions of the electrolytic plated film by using an etchant.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
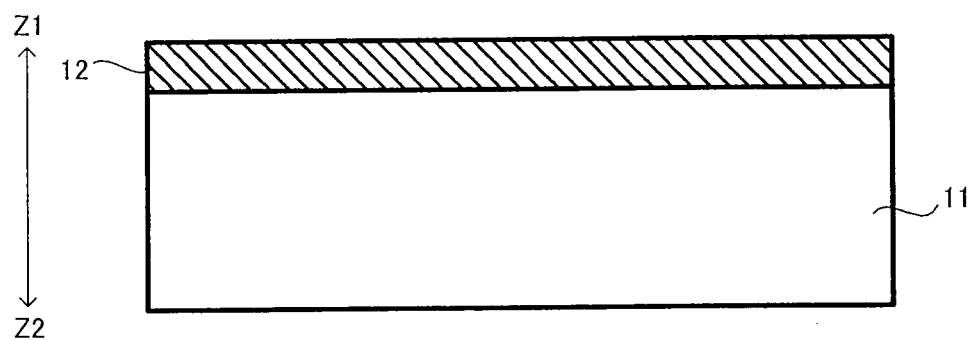
FIG. 1 is a view to illustrate a step for forming an electroless plated film in a manufacturing method for a printed wiring board according to the first embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board, corresponding to a direction along a normal line to main surfaces (upper and lower surfaces) of a wiring board (or a direction of the thickness of a core substrate).

In each embodiment, the two main surfaces of a wiring board are referred to as a first surface (the surface on arrow-Z1 side) and as a second surface (the surface on arrow-Z2 side). In a lamination direction, a side closer to the core is referred to as a lower layer, and a side farther from the core as an upper layer. A layer including a conductive pattern which functions as wiring for circuits or the like is referred to as a wiring layer. A conductor formed on the wall surface of a through-hole is referred to as a through-hole conductor. Also, a conductor which is formed in a via hole and electrically connects the upper wiring layer and the lower wiring layer to each other is referred to as an interlayer connection conductor.

First Embodiment

In a manufacturing method for a printed wiring board according to the present embodiment, as shown in FIG. 1, for example, insulation layer 11 is prepared first, and electroless plated film 12 (chemical copper) made of copper is formed on the first surface of insulation layer 11 by electroless copper plating, for example. Electroless plated film 11 works as a power-supply layer (seed layer) for electrolytic plating. Insulation layer 12 is made of, for example, epoxy resin, prepreg or the like, and used as an interlayer insulation layer, for example. The material for electroless plated film 12 is not limited to copper, and other metals may also be used. However, when used for wiring in a wiring board, copper is preferred in view of its resistance.

Figure 2:
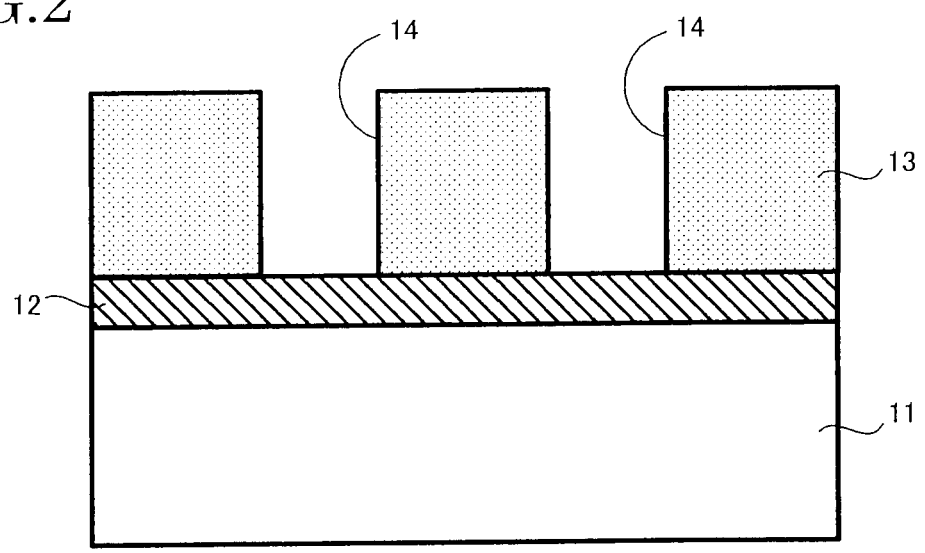
FIG. 2 is a view to illustrate a step for forming a plating resist in the first embodiment.

Next, as shown in FIG. 2, for example, plating resist 13 is formed on electroless plated film 12. Plating resist 13 has opening 14 which exposes part of electroless plated film 12. Plating resist 13 of the present embodiment is a dry film with a thickness of 25 μm, for example.

Figure 3:
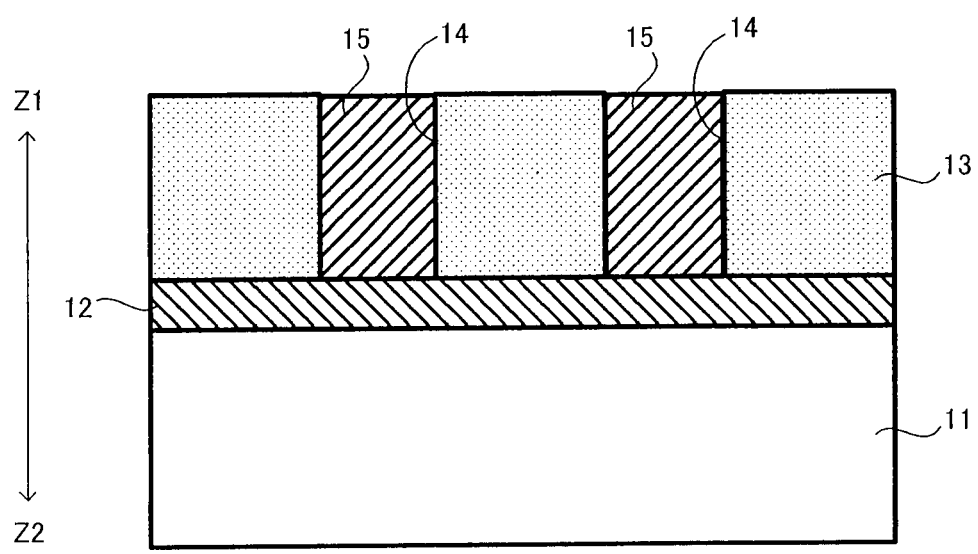
FIG. 3 is a view to illustrate a step for forming an electrolytic plated film in the first embodiment.

Next, as shown in FIG. 3, for example, by performing copper electrolytic plating from the first-surface side, electrolytic plated film 15 is formed on electroless plated film 12 exposed through opening 14.

Figure 4:
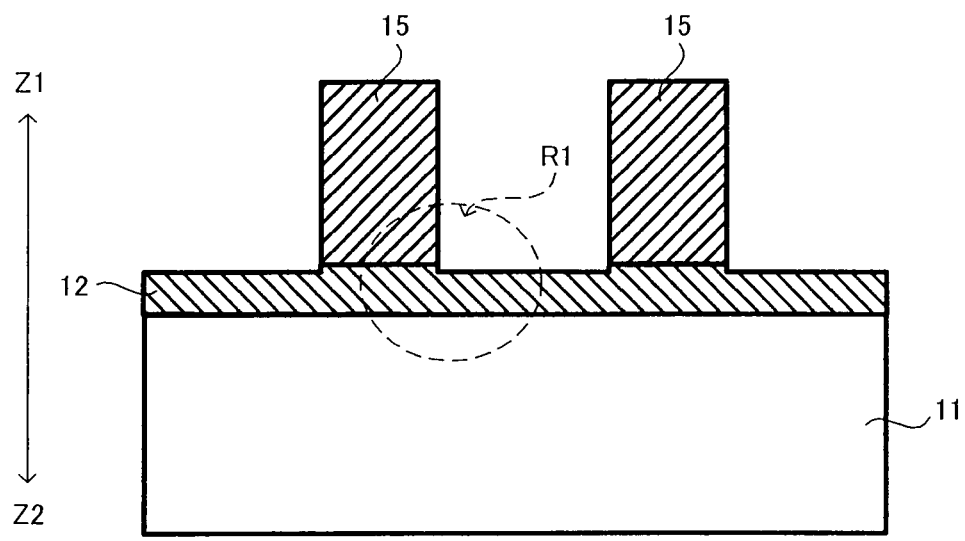
FIG. 4 is a view to illustrate a step for removing the plating resist in the first embodiment.

Next, plating resist 13 is removed using a resist-removing solution containing amine, solvent, strong alkali and water. During that time, as shown in FIG. 4, electroless plated film 12 existing between adjacent portions of electrolytic plated film 15 is etched by the resist-removing solution. Namely, the thickness of electroless plated film 12 is reduced. At that time, the temperature of the resist-removing solution is preferred to be between room temperature and 60° C.; it is especially preferred to be set between 50-60° C.

In the present embodiment, when plating resist 13 is removed by the resist-removing solution, electroless plated film 12 beneath plating resist 13 is removed at the same time. Without bound by theories and/or assumptions, the mechanism of copper (Cu) dissolved by amines (R—NH$_2$) may be thought as follows. Ammonium (NH$_3$) is a tracer of amines, and if amines exist, ammonium always exists.

(1)

Copper is oxidized and becomes copper oxide. Then, through reactions of copper oxide and ammonium ingredients, a copper (II) ammine complex is produced. As a result, the copper dissolves.

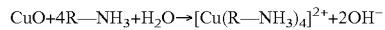

(2)

Through reactions of copper hydroxide and ammonium ingredients, a copper (II) ammine complex is produced. As a result, the copper dissolves.

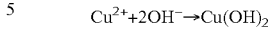

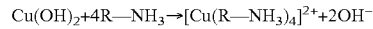

It is thought that copper dissolves under the mechanism of the above mechanisms (1) or (2). Moreover, it is also thought that copper will dissolve when the produced copper (II) ammine complex works as an oxidization agent and a copper (I) ammine complex is produced.

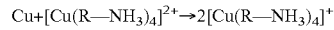

Figure 5:
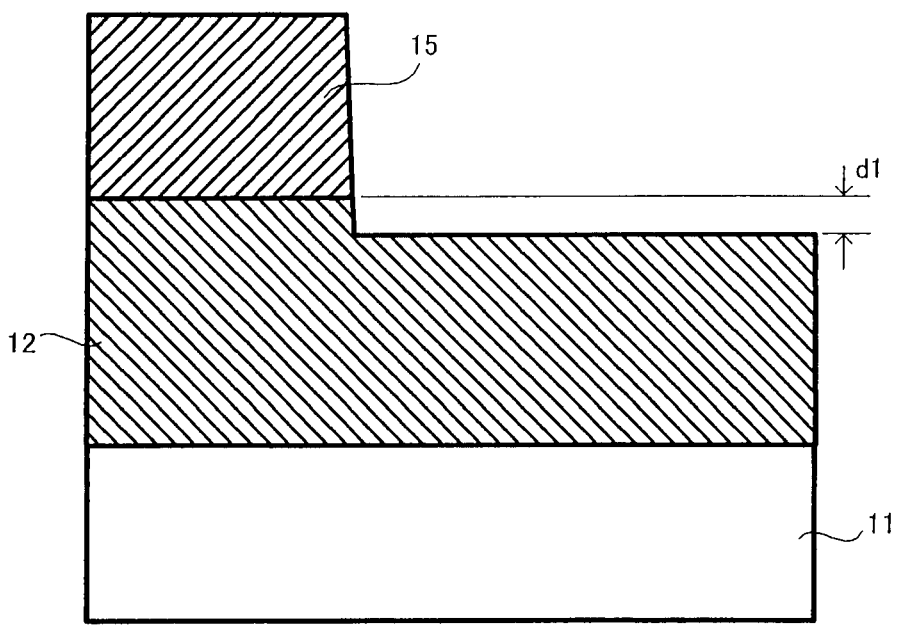
FIG. 5 is a partially magnified view of FIG. 4.

FIG. 5 shows a magnified view of region (R1) in FIG. 4. Electroless plated film 12 existing between adjacent portions of electrolytic plated film is etched only by etching amount (d1) using the resist-removing solution. The greater the etching amount (d1), the more preferable it is, and the more it will contribute to reducing time for quick etching later.

The amine concentration in the resist-removing solution is preferred to be 5-50 weight percent. As for such amines, at least one kind of amine selected from among the following is preferred: ethanolamine, N-methyl ethanolamine, N-ethyl ethanolamine, diethanoleamine, isopropanolamine, 2-(2-aminoethoxy)ethanol, ethylenediamine, propanediamine, butylenediamine, diethylenetriamine, piperazine, morpholine, triethylenetetramine, tetraethylenepentamine and pentaethylenehexamine.

As for the strong alkali in the resist-removing solution, at least one kind selected from among the following is preferred: tetramethyl ammonium hydroxide, choline hydroxide, diazabicycloundecene, tetraethyl ammonium hydroxide and tetrabutyl ammonium hydroxide.

Figure 6:
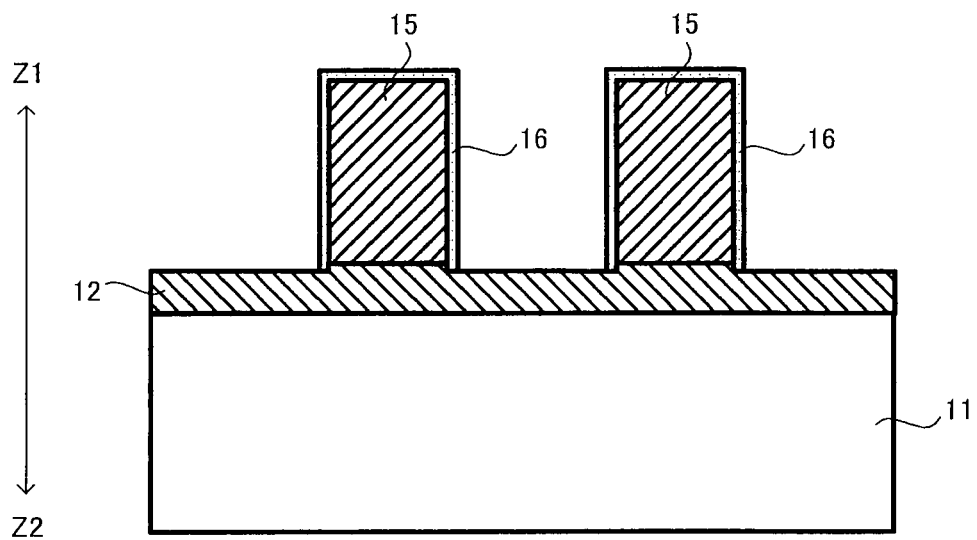
FIG. 6 is a view showing a state where a complex is formed on a surface of the electrolytic plated film through a reaction with an etchant.

Next, etching (quick etching) of electroless plated film 12 existing between adjacent portions of electrolytic plated film is conducted. At that time, it is preferred to use an etchant which includes a heterocyclic compound (a chelate agent) containing nitrogen atoms in the form of "—NH—" or "=N—". Such a heterocyclic compound tends to be adsorbed onto electrolytic copper-plated film 15 rather than onto electroless plated film 12. Accordingly, through chemical bonding with copper that forms electrolytic plated film 15, the heterocyclic compound produces complex 16 shown in FIG. 6 on the surface of electrolytic plated film 15. Complex 16 coats the surface of electrolytic plated film 15 and functions as an etching resist (protective film).

As for such heterocyclic compounds, azoles such as tetrazoles and triazoles may be listed. As for tetrazoles, 1H-tetrazole, 5-methyl-1H-tetrazole, 5-phenyl-1H-tetrazole and 5-amino-1H-tetrazole are listed. Especially, 5-amino-1H-tetrazole may be preferably used. As for triazoles, 1H-1,2,4-triazole, 3-amino-1,2,4-triazole and the like are listed.

Conditions for quick etching are, for example, processing temperature of 20-60° C. Especially, it is preferred to be set at 50-60° C. If the processing temperature exceeds 60° C., it is not preferable, since decomposition of hydrogen peroxide may possibly be facilitated. Processing time for quick etching is 30-120 seconds. Also, an etchant is used which contains, for example, sulfuric acid, hydrogen peroxide and azoles.

The concentration of sulfuric acid contained in the etchant is preferred to be 0.5-15 wt. %. Especially, 2.0-3.0 wt. % is preferred. The concentration of hydrogen peroxide is preferred to be 0.5-3.0 wt. % from a viewpoint of ease in controlling the etching amount. Especially, 0.7-1.0 wt. % is preferred. The concentration of azoles is preferred to be 0.001-0.01 wt. % from a viewpoint of achieving both inhibitor effects on the electrolytic plated film and etching performance on the electroless plated film. Especially, 0.003-0.009 wt. % is preferred.

In addition, the etchant is preferred to contain chloride ions at a concentration of 1 ppm or less. In such a case, copper (I) chloride which inhibits dissolution of electroless plated film is suppressed from forming. When the wiring width is 10 μm or less, the amount of electrolytic plated film 15 etched by the etchant is preferred to be 2.0 μm or less.

Regarding an etchant, the etching rate of electroless plated film 12 to that of electrolytic plated film 15 is preferred to be 2 or greater. Ten or greater is especially preferred.

Figure 7:
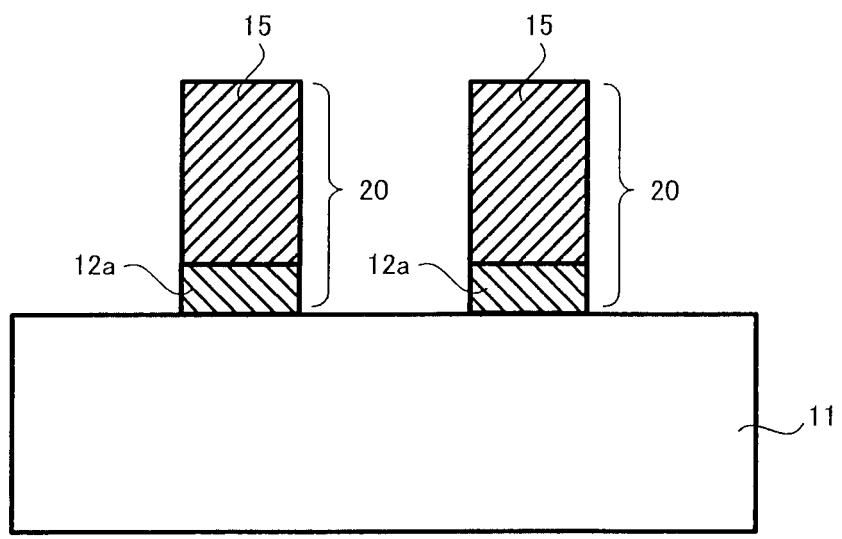
FIG. 7 is a view to illustrate a step for removing an electroless plated film by etching in the first embodiment.
Figure 8:
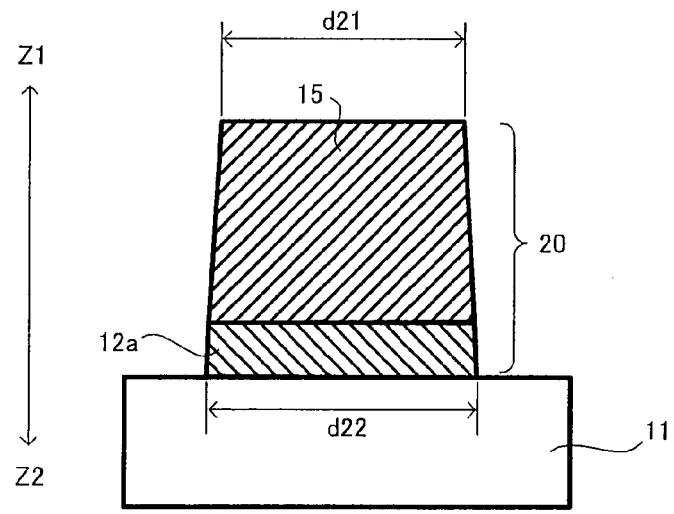
FIG. 8 is a magnified view of wiring formed by the manufacturing method according to the first embodiment.

Through such etching, electroless plated film 12 existing between adjacent portions of electrolytic plated film 15 is etched as shown in FIG. 7. As a result, wiring 20 is formed, made of electroless plated film (12a) formed on insulation layer 11 and of electrolytic plated film 15 formed on electroless plated film (12a). Wiring 20 is formed to be, for example, L/S=10 μm/10 μm. Conductive patterns are formed with such wiring 20. FIG. 8 shows a magnified view of wiring 20. The difference (d22−d21) between top width (d21) and bottom width (d22) of wiring 20 is 2 μm or less. Namely, undercut can hardly be noted. Accordingly, even when "S" (wiring space) is narrow, ensuring insulation between wires can be done easily. Also, the aspect ratio of wiring 20 is set at 3 or greater.

In the manufacturing method of the present embodiment, when removing plating resist 13 before quick etching, the thickness of electroless plated film 12 existing between adjacent portions of electrolytic plated film 15 is reduced by a resist-removing solution. Thus, the etching time of electroless plated film 12 may be shortened. In addition, the etching resistance of electrolytic plated film 15 is enhanced by a complex formed through chemical bonding of a heterocyclic compound containing nitrogen atoms with copper. Thus, the etching amount (etching rate) of electrolytic plated film 15 is reduced. Accordingly, wiring 20 to be formed seldom tapers and has side walls substantially perpendicular to the surface on which it is formed (bottom surface). Experiments have confirmed that the decrease in the line width of wiring 20 in the present embodiment is smaller than those in cases which used a resist-removing solution mainly containing NaOH, and an etchant without azoles. In cases which used a resist-removing solution mainly containing NaOH, and an etchant without azoles, the bottom width of wiring was remarkably greater than the top width, and wiring having a trapezoidal cross section was obtained.

According to the manufacturing method of the present embodiment, a printed wiring board with fine-pitch wiring (fine patterns) may be manufactured by suppressing the wires from narrowing when forming wiring.

Also, since electrolytic plated film 15 is not required to be formed more thickly than necessary, the width of plating resist 13 is sufficiently ensured. Thus, without experiencing lowered adhesiveness in plating resist 13, fine-pitch wiring may be formed.

The manufacturing method of the present invention is especially effective when forming conductive patterns with an "L" (wiring width) of 10 μm or less, or conductive patterns with an "S" (wiring space) of 10 μM or less.

Second Embodiment

Figure 9:
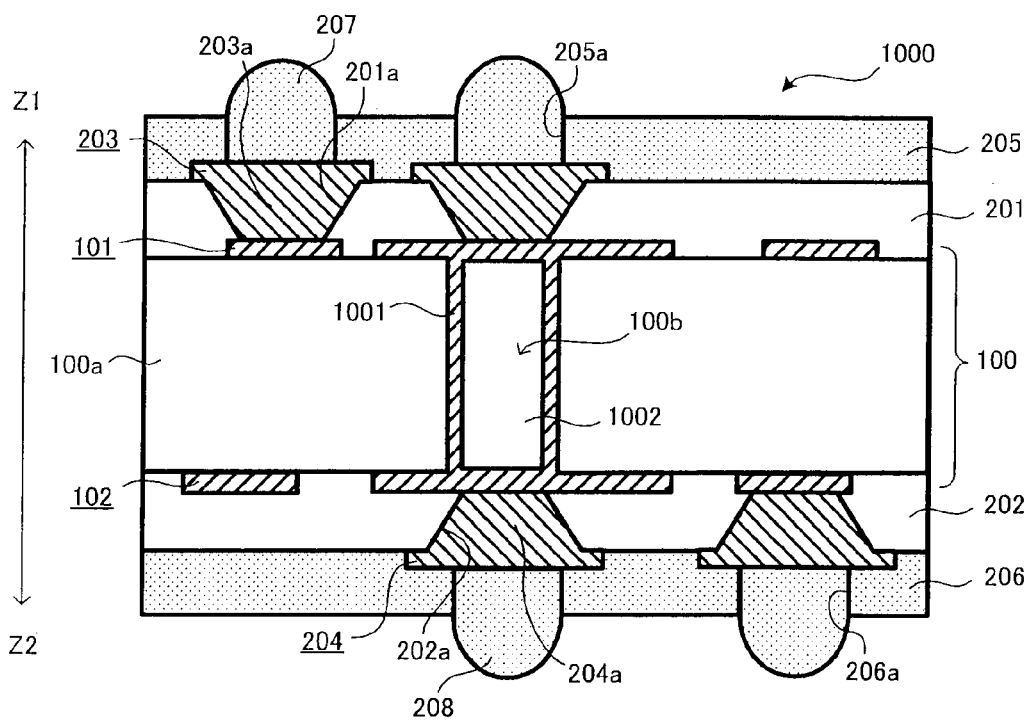
FIG. 9 is a view showing a printed wiring board manufactured according to the second embodiment of the present invention.

In the present embodiment, using the manufacturing method in the first embodiment described above, wiring board 1000 is manufactured as shown in FIG. 9. Wiring board 1000 is a multilayer printed wiring board.

Wiring board 1000 has core substrate 100, insulation layers (201, 202), wiring layers (203, 204) made of copper, for example, solder-resist layers (205, 206) and external connection terminals (207, 208) made of solder.

Core substrate 100 has substrate (100a), wiring layers (101, 102) made of copper, for example, and through-hole connection portion (100b). Wiring layer 101 is formed on the first surface of substrate (100a), and wiring layer 102 is formed on the second surface of substrate (100a). Through-hole connection portion (100b) has through-hole conductor 1001 and insulative material 1002. Through-hole conductor 1001 is formed on the wall surface of a through-hole, inside of which insulative material 1002 is filled. Substrate (100a) is made of epoxy resin, for example. Epoxy resin is preferred to include a reinforcing material such as glass fabric or aramid fabric, which is then impregnated with resin. Such a reinforcing material is a material with a thermal expansion coefficient smaller than that of the primary material (epoxy resin).

Insulation layer 201 is formed on the first surface of core substrate 100, and insulation layer 202 is formed on the second surface of core substrate 100. Insulation layers (201, 202) work as interlayer insulation layers. Insulation layers (201, 202) are made of cured prepreg, for example. As for prepregs, for example, those made of the following are used: base material such as glass fabric or aramid fabric impregnated with resins such as epoxy resin, polyester resin, bismaleimide triazine resin (BT resin), imide resin (polyimide), phenol resin or allyl polyphenylene ether resin (A-PPE resin). Instead of prepreg, however, liquid or film thermosetting resins and thermoplastic resins, or compounds of such may be used. Moreover, RCF (resin-coated copper foil) may also be used.

Via hole (201a) is formed in insulation layer 201, and via hole (202a) is formed in insulation layer 202. By filling conductor in via holes (201a, 202a), interlayer connection conductors (203a, 204a) are formed. Interlayer connection conductors (203a, 204a) are each filled vias. However, they are not limited to such. For example, interlayer connection conductors (203a, 204a) may be conformal vias where conductor is formed on the wall surfaces of via holes (201a, 202a). Through such filled vias or conformal vias, wiring layers (101, 203) positioned one above the other are electrically connected.

Wiring layer 203 and solder-resist layer 205 are formed on the first surface of insulation layer 201, and wiring layer 204 and solder-resist layer 206 are formed on the second surface of insulation layer 202. Solder-resist layers (205, 206) are each made of resins such as photosensitive resins using acrylic-epoxy resin, thermosetting resins mainly containing epoxy resin, and ultra-violet setting resins.

In solder-resist layer 205, opening (205a) is formed to expose part of wiring layer 203. Also, in solder-resist layer 206, opening (206a) is formed to expose part of wiring layer 204. External connection terminal 207 is formed in opening (205a), and external connection terminal 208 is formed in opening (206a). External connection terminals (207, 208) are used for electrical connection with other wiring boards or electronic components, for example. By being mounted on other wiring boards from one or both of its surfaces, for example, wiring board 1000 may be used as a circuit board for cell phones or the like.

Figure 10:
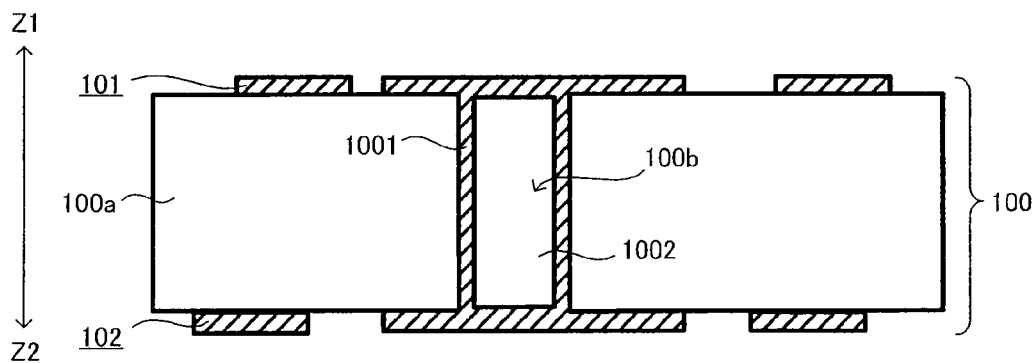
FIG. 10 is a view showing a core substrate in a manufacturing method for a printed wiring board according to the second embodiment.
Figure 11:
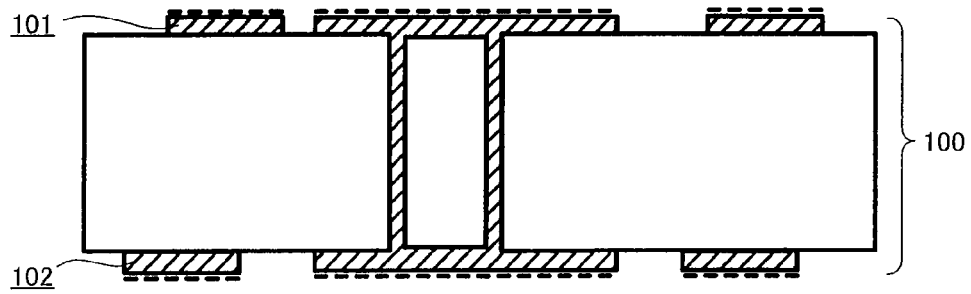
FIG. 11 is a view to illustrate a step for roughening the surfaces of conductive patterns in the second embodiment.
Figure 12:
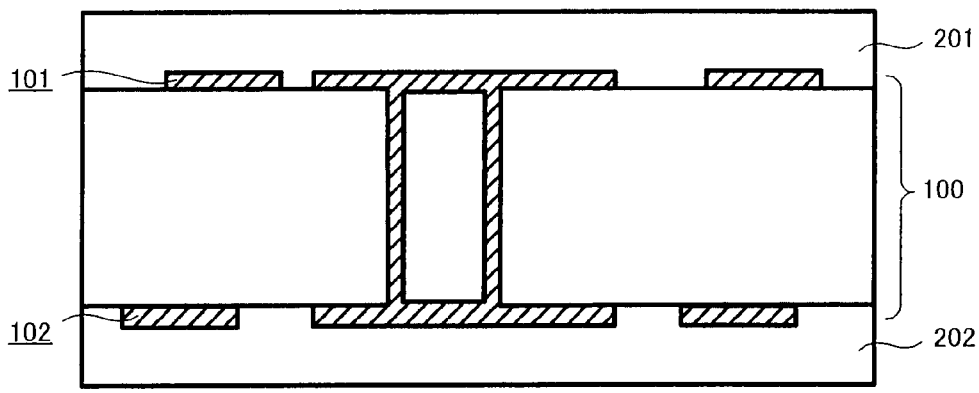
FIG. 12 is a view to illustrate a step for forming insulation layers in the second embodiment.

When manufacturing wiring board 1000, first, a core substrate 100 as shown in FIG. 10 is prepared, for example. Then, as shown in FIG. 11, the surfaces of wiring layers (101, 102) are roughened by etching, for example. In doing so, adhesiveness is ensured with insulation layers (201, 202) to be formed on their upper layers. Next, as shown in FIG. 12, for example, insulation layer 201 is formed on the first surface of core substrate 100, and insulation layer 202 is formed on the second surface of core substrate 100.

Figure 13:
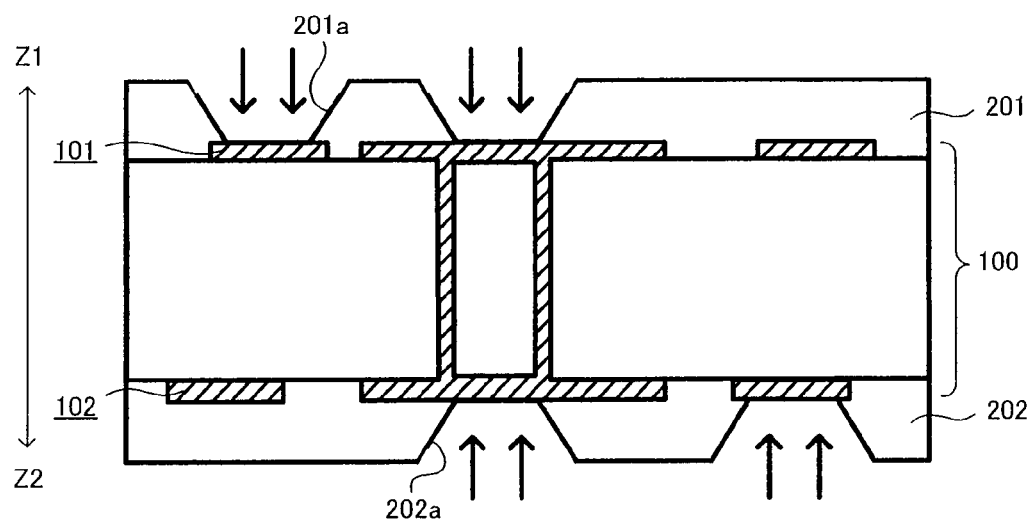
FIG. 13 is a view to illustrate a step for forming via holes in the insulation layers in the second embodiment.
Figure 14:
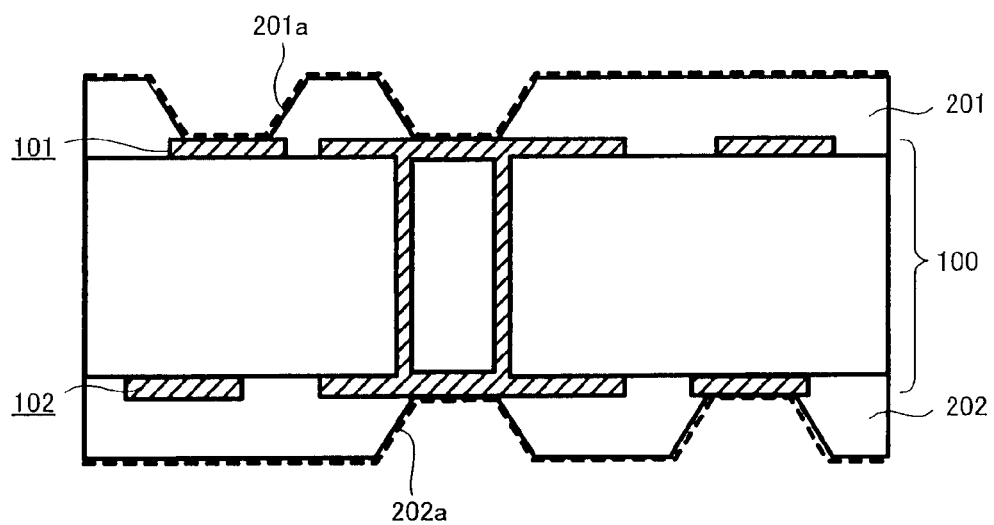
FIG. 14 is a view to illustrate a step for roughening the surfaces of the insulation layers in the second embodiment.

Next, as shown in FIG. 13, using a laser, for example, via hole (201a) is formed in insulation layer 201, and via hole (202a) is formed in insulation layer 202. Then, as shown in FIG. 14, the surfaces of insulation layers (201, 202) are roughened by etching, for example. In doing so, resin residue is removed.

Figure 15:
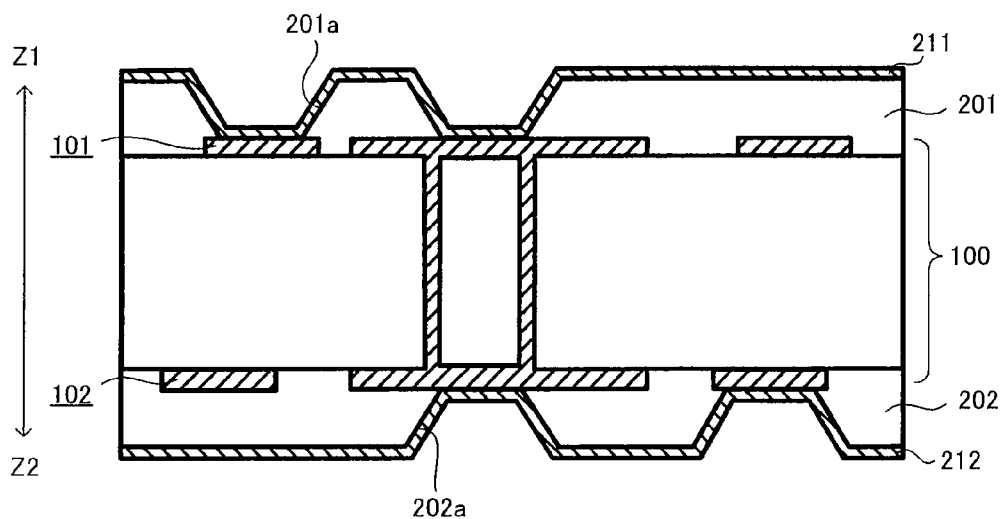
FIG. 15 is a view to illustrate a step for forming electroless plated films in the second embodiment.

Next, as shown in FIG. 15, for example, electroless plated films (211, 212) is formed by copper electroless plating. Electroless plated films (211, 212) work as power-supply layers (seed layers) for electrolytic plating.

Figure 16:
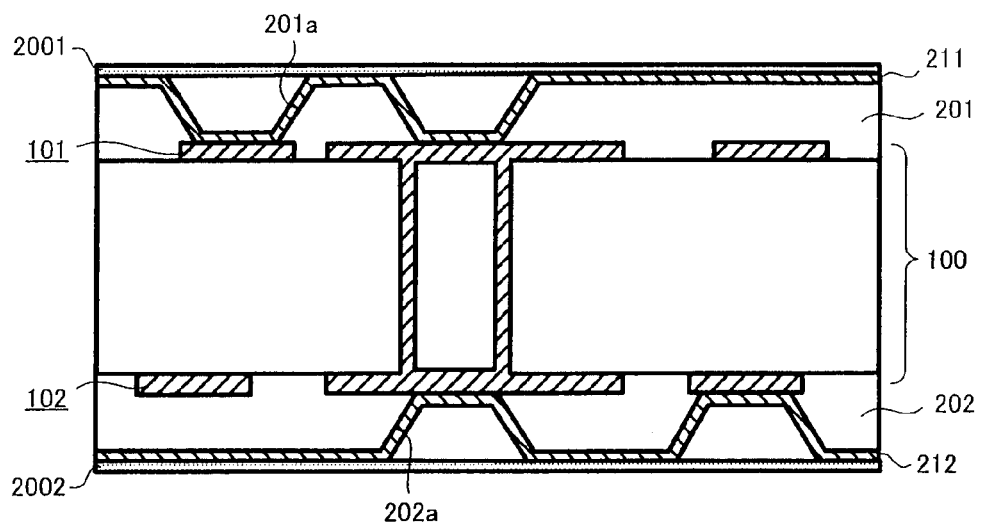
FIG. 16 is a view to illustrate a step for forming plating resists in the second embodiment.

Next, as shown in FIG. 16, for example, dry films (2001, 2002) are formed on electroless plated films (211, 212). Dry films (2001, 2002) are each made of photosensitive resin, for example.

Figure 17:
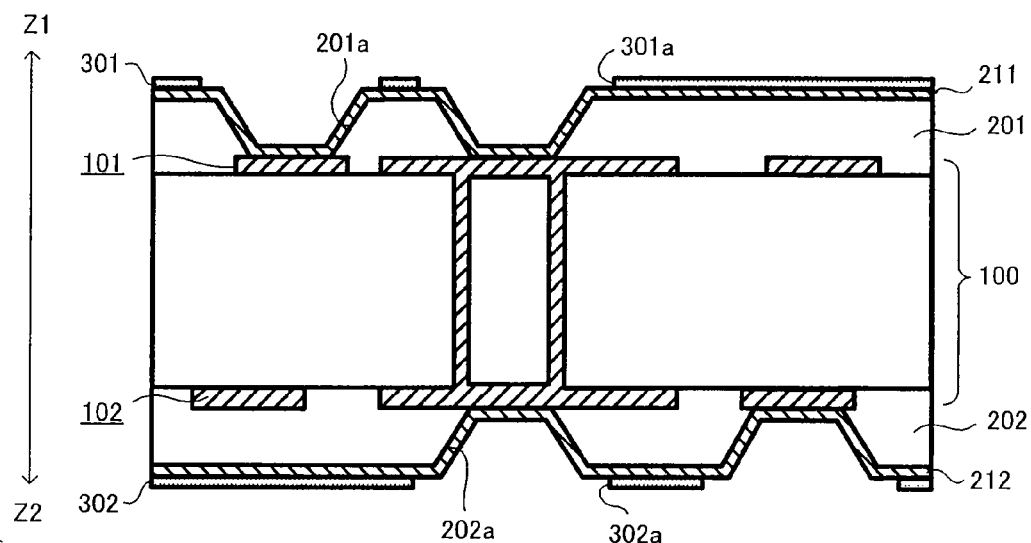
FIG. 17 is a view to illustrate a step for forming openings in the resists in the second embodiment.

Next, as shown in FIG. 17, for example, by removing areas not exposed to light using a developing solution, plating resists (301, 302) with openings (301a, 302a) which expose electroless plated films (211, 212) are formed. By forming openings (301a, 302a), electroless plated films (211, 212) are partially exposed.

Figure 18:
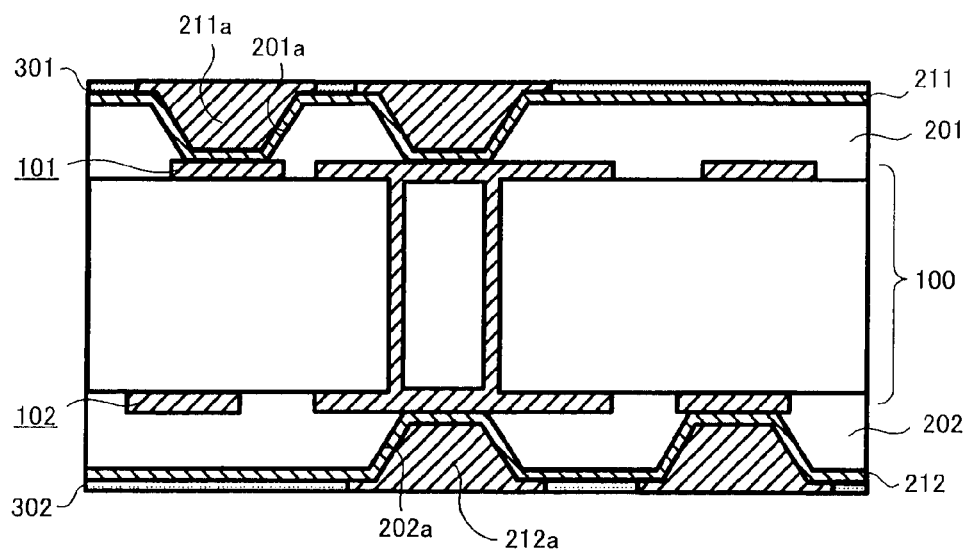
FIG. 18 is a view to illustrate a step for forming electrolytic plated films in the second embodiment.

Next, as shown in FIG. 18, for example, by performing electrolytic copper plating, electrolytic plated films (211a, 212a) are formed on electroless plated films (211, 212) exposed through openings (301a, 302a).

Figure 19:
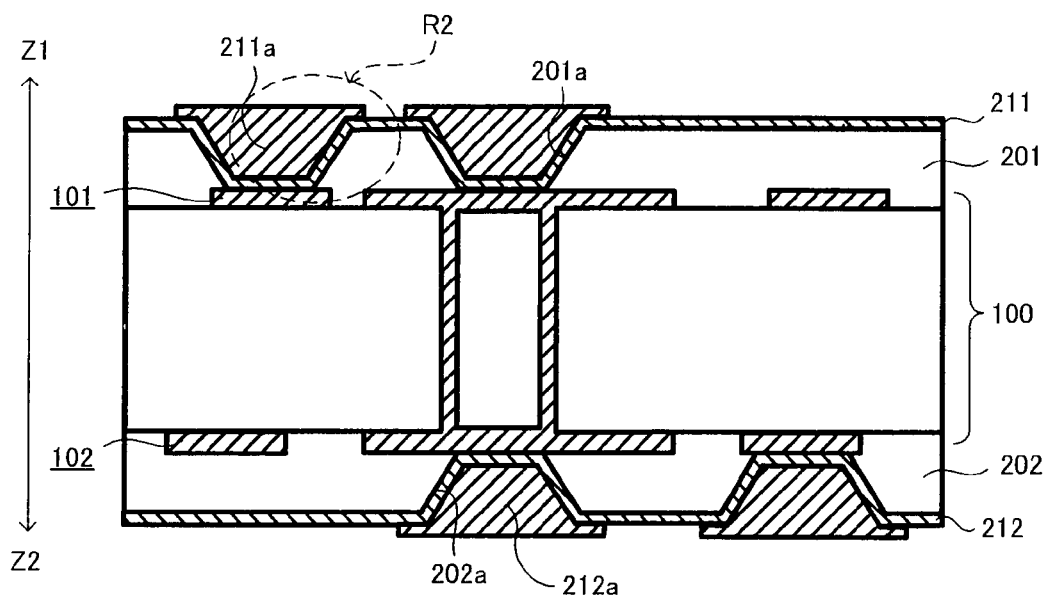
FIG. 19 is a view to illustrate a step for removing the resists in the second embodiment.
Figure 20:
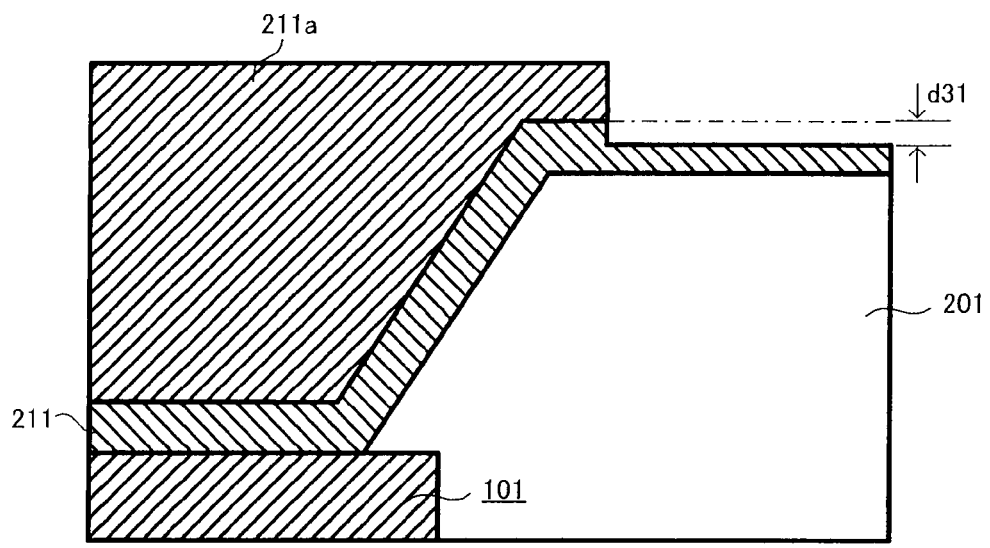
FIG. 20 is a view to illustrate a step for reducing the thickness of the electroless plated films in the second embodiment.

Next, as shown in FIG. 19, for example, plating resists (301, 302) are removed using a resist-removing solution containing amine, solvent, strong alkali and water. Moreover, as shown in FIG. 20 (a magnified view of region (R2) in FIG. 19), the thicknesses of electroless plated films (211, 212) existing between adjacent portions of electrolytic plated film (211a) (between portions of electrolytic plated film (212a)) are reduced using the resist-removing solution. At the same time when plating resists (301, 302) are removed by the resist-removing solution, electroless plated films (211, 212) beneath plating resists (301, 302) are dissolved by (d31).

Figure 21:
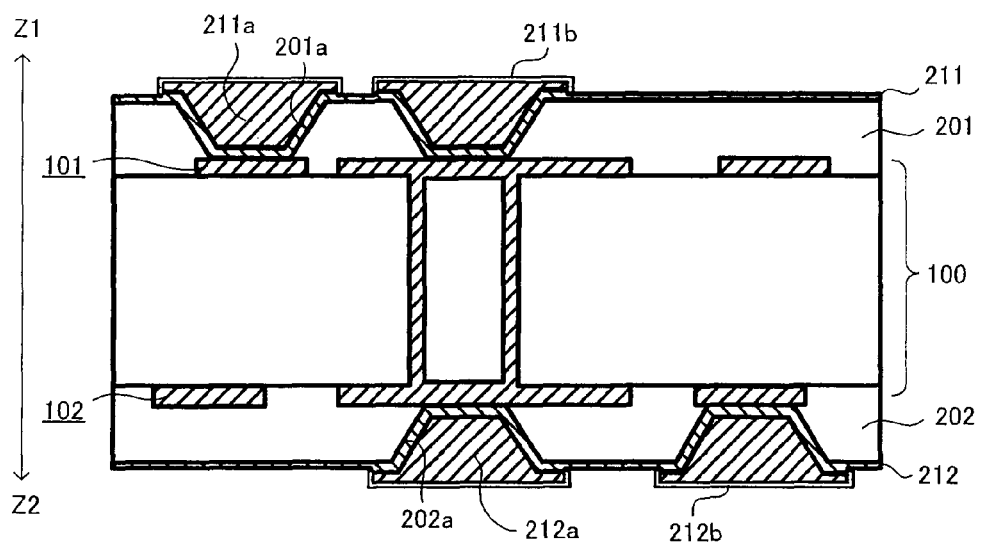
FIG. 21 is a view showing a state where complexes are formed on the surfaces of the electrolytic plated films through a reaction with an etchant.

As described above, the same as in the first embodiment, electroless plated films (211, 212) also become thinner in the present embodiment by removing plating resists (301, 302) using the resist-removing solution prior to conducting etching. Then, etching (quick etching) is conducted on electroless plated films (211, 212). At that time, if using an etchant which includes a heterocyclic compound (a chelate agent) containing nitrogen atoms in the form of "—NH—" or "=N—", through chemical bonding of the heterocyclic compound and copper, complexes (211b, 212b) are formed on the surfaces of electrolytic plated films (211a, 212a) as shown in FIG. 21, for example. The heterocyclic compound tends to be adsorbed onto electrolytic plated films (211a, 212a) rather than onto electroless plated films (211, 212). Complexes (211b, 212b) coat the surfaces of electrolytic plated films (211a, 212a) and work as resists (protective films).

Figure 22:
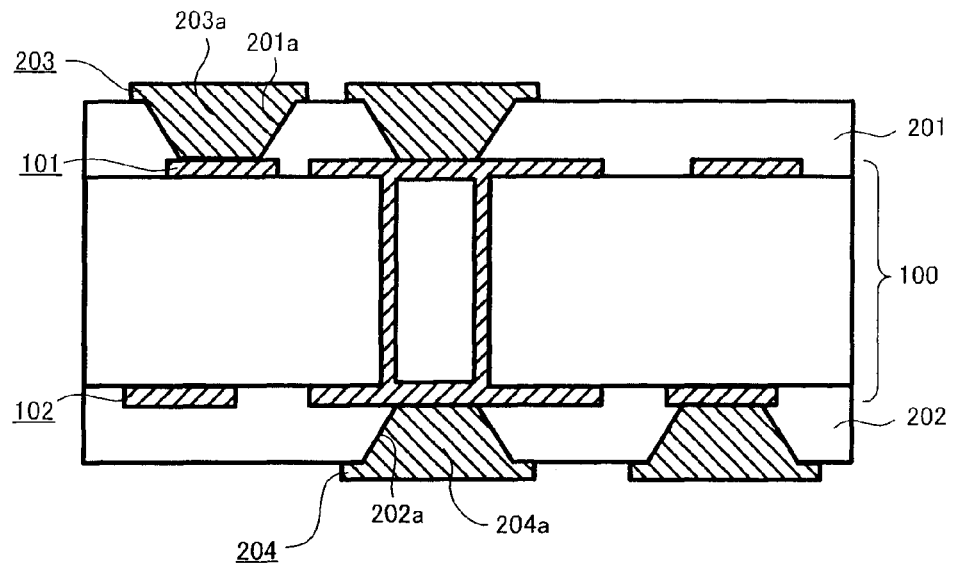
FIG. 22 is a view to illustrate a step for removing the electroless plated films by etching in the second embodiment.

Through such etching, as shown in FIG. 22, electroless plated films (211, 212) are patterned, and wiring layers (203, 204) and interlayer connection conductors (203a, 204a) are formed, made of electroless plated film and electrolytic plated film. Since undercuts also seldom occur in such cases, even if the "S" (wiring space) is narrow, ensuring insulation between wires can be done easily (see FIG. 8). Also, the aspect ratio of the wiring included in wiring layers (203, 204) is 3 or greater.

After that, solder-resist layers (205, 206) are formed by coating or lamination, for example, and forms openings (205a, 206a) in solder-resist layers (205, 206) using a photolithographic technique, for example. Next, solder paste is printed or solder balls are mounted in openings (205a, 206a), and a reflow is conducted to form external connection terminals (207, 208) (solder bumps) in openings (205a, 206a). Accordingly, wiring board 1000 is completed (FIG. 9).

Wiring board 1000 is a double-sided printed wiring board having wiring layers (203, 204) on the upper and lower surfaces of the core. However, such is not the only type that can be manufactured under the present invention. For example, the manufacturing method according to the present invention may be applied to manufacture, for example, a single-sided printed wiring board having a wiring layer only on either the upper or the lower surface of the core.

So far, a manufacturing method for a printed wiring board according to the embodiments of the present invention is described. However, the present invention is not limited to the above embodiments. For example, the present invention may be carried out by modifying as follows.

The contents and the order of the steps of the above embodiments may be modified within a scope that does not deviate from the gist of the present invention. Also, some steps may be omitted according to requirements or the like.

In the above embodiments, the wiring surfaces were roughened. Instead, Sn plating may be performed on wiring surfaces, while applying an organic compound such as a silane coupling agent. In such cases, adhesiveness is ensured between wiring and interlayer insulation layers by means of the organic compound. Moreover, since wiring surfaces are not roughened, signal transmission delays due to a skin effect will be suppressed.

The type of amines to be used for a resist-removing solution is not limited specifically. For example, other than those described above, those described in Japanese Laid-Open Patent Application 2003-140364 may also be used. The contents of Japanese Laid-Open Patent Application 2003-140364 are incorporated herein by reference in their entirety in the present application.

In addition, the type of heterocyclic compounds containing nitrogen atoms in the form of "—NH—" or "=N—" in an etchant is not limited specifically. For example, other than those described above, those described in Japanese Patent No. 3711565 may also be used. The contents of Japanese Patent No. 3711565 are incorporated herein by reference in their entirety in the present application.

Obviously, numerous modifications and variations of the present invention are possible in light of the above teachings. It is therefore to be understood that within the scope of the appended claims, the invention may be practiced otherwise than as specifically described herein.

What is claimed is:

1. A manufacturing method for a printed wiring board, comprising:
   forming an electroless plated film on a roughened surface of an interlayer resin insulation layer;
   forming on the electroless plated film a plating resist with an opening to expose a portion of the electroless plated film;
   forming an electrolytic plated film on the portion of the electroless plated film exposed through the opening;
   applying a resist-removing solution containing an amine and a strong alkali such that the resist-removing solution removes the plating resist and reduces a thickness of a portion of the electroless plated film existing between adjacent portions of the electrolytic plated film; and
   applying an etchant such that the portion of the electroless plated film existing between the adjacent portions of the electrolytic plated film is removed and a conductive pattern is formed.

2. The manufacturing method for a printed wiring board according to claim 1, further comprising roughening a surface of the interlayer resin insulation layer such that the roughened surface of the interlayer resin insulation layer is formed.

3. The manufacturing method for a printed wiring board according to claim 1, wherein the forming of the electrolytic plated film and the forming of the electroless plated film comprise forming an electrolytic plated film made of copper and forming an electroless plated film made of copper.

4. The manufacturing method of a printed wiring board according to claim 1, wherein the amine has a concentration set at 5-50 wt. % in the resist-removing solution.

5. The manufacturing method for a printed wiring board according to claim 1, wherein the amine is at least one compound selected from the group consisting of ethanolamine, N-methyl ethanolamine, N-ethyl ethanolamine, diethanoleamine, isopropanolamine, 2-(2-aminoethoxy)ethanol, ethylenediamine, propanediamine, butylenediamine, diethylenetriamine, piperazine, morpholine, triethylenetetramine, tetraethylenepentamine and pentaethylenehexamine.

6. The manufacturing method for a printed wiring board according to claim 1, wherein the resist-removing solution further contains a solvent and water.

7. The manufacturing method for a printed wiring board according to claim 1, wherein the strong alkali is at least one compound selected from the group consisting of tetramethyl ammonium hydroxide, choline hydroxide, diazabicycloundecene, tetraethyl ammonium hydroxide and tetrabutyl ammonium hydroxide.

8. The manufacturing method for a printed wiring board according to claim 1, wherein the applying of the resist-removing solution is carried out by using the resist-removing solution at a temperature of 50-60° C.

9. The manufacturing method for a printed wiring board according to claim 1, wherein the etchant includes heterocyclic compound which contains nitrogen atoms in a form of —NH— or =N—.

10. The manufacturing method for a printed wiring board according to claim 1, wherein the etchant contains chloride ions at a concentration of 1 ppm or less.

11. The manufacturing method for a printed wiring board according to claim 1, wherein the etchant has an etching rate of the electroless plated film which is at least twice greater than an etching rate of the electrolytic plated film.

12. The manufacturing method for a printed wiring board according to claim 1, wherein the etchant contains sulfuric acid at a concentration of 2.0-3.0 wt. %, and hydrogen peroxide at a concentration of 0.7-1.0 wt. %.

13. The manufacturing method for a printed wiring board according to claim 1, wherein a difference between the top width and the bottom width of wiring included in the conductive pattern is set at 2 μm or less.

14. The manufacturing method for a printed wiring board according to claim 1, wherein an amount of etching of the electrolytic plated film by the etchant is 2 μm or less.

15. The manufacturing method for a printed wiring board according to claim 1, wherein a width of wiring included in the conductive pattern is 10 μm or less.

16. The manufacturing method for a printed wiring board according to claim 1, wherein a distance between wirings included in adjacent portions of the conductive pattern is 10 μm or less.

17. The manufacturing method for a printed wiring board according to claim 1, wherein an aspect ratio of wiring included in the conductive pattern is 3 or greater.

18. The manufacturing method for a printed wiring board according to claim 5, wherein the strong alkali is at least one compound selected from the group consisting of tetramethyl ammonium hydroxide, choline hydroxide, diazabicycloundecene, tetraethyl ammonium hydroxide and tetrabutyl ammonium hydroxide.

19. The manufacturing method of a printed wiring board according to claim 18, wherein the amine has a concentration set at 5-50 wt. % in the resist-removing solution.

20. The manufacturing method for a printed wiring board according to claim 19, wherein the forming of the electrolytic plated film and the forming of the electroless plated film comprise forming an electrolytic plated film made of copper and forming an electroless plated film made of copper.

* * * * *